(12) United States Patent
Ito et al.

(10) Patent No.: US 9,209,282 B2
(45) Date of Patent: Dec. 8, 2015

(54) METHOD OF MANUFACTURING THIN FILM TRANSISTOR SUBSTRATE AND THIN FILM TRANSISTOR SUBSTRATE MANUFACTURED BY THE METHOD

(71) Applicant: Sharp Kabushiki Kaisha, Osaka-shi, Osaka (JP)

(72) Inventors: Kazuatsu Ito, Osaka (JP); Hidehito Kitakado, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/373,461

(22) PCT Filed: Jan. 16, 2013

(86) PCT No.: PCT/JP2013/000163
§ 371 (c)(1),
(2) Date: Jul. 21, 2014

(87) PCT Pub. No.: WO2013/111533
PCT Pub. Date: Aug. 1, 2013

(65) Prior Publication Data
US 2015/0008429 A1    Jan. 8, 2015

(30) Foreign Application Priority Data

Jan. 23, 2012 (JP) .................................. 2012-011157

(51) Int. Cl.
*H01L 29/786* (2006.01)
*H01L 29/66* (2006.01)
*H01L 23/532* (2006.01)
(Continued)

(52) U.S. Cl.
CPC .... *H01L 29/66969* (2013.01); *H01L 21/02565* (2013.01); *H01L 21/441* (2013.01); *H01L 21/477* (2013.01); *H01L 23/53238* (2013.01); *H01L 27/1225* (2013.01); *H01L 29/45* (2013.01); *H01L 29/7869* (2013.01); *G02F 1/1368* (2013.01); *G02F 2001/136295* (2013.01); *H01L 29/41733* (2013.01); *H01L 2924/0002* (2013.01)

(58) Field of Classification Search
None
See application file for complete search history.

(56) References Cited

U.S. PATENT DOCUMENTS

2010/0123131 A1*  5/2010  Tokunaga ........................ 257/43
2010/0163867 A1*  7/2010  Yamazaki et al. ............... 257/43
2011/0147753 A1    6/2011  Onishi et al.

FOREIGN PATENT DOCUMENTS

EP    2 579 237 A1    4/2013
JP    04-192527 A     7/1992
(Continued)

OTHER PUBLICATIONS

Official Communication issued in International Patent Application No. PCT/JP2013/000163, mailed on Feb. 26, 2013.

*Primary Examiner* — Fernando L Toledo
*Assistant Examiner* — Valerie N Newton
(74) *Attorney, Agent, or Firm* — Keating & Bennett, LLP (57) ABSTRACT

The present invention includes at least a step forming a source electrode (32) and a drain electrode (33), each of which is a multilayer film of a first conductive film (32a), (33a) made of titanium or molybdenum, a second conductive film (32b), (33b) made of copper, and a third conductive film (32c), (33c) made of titanium oxide, a step of forming passivation film (18), which is an inorganic insulating film, on an oxide semiconductor layer (13), the source electrode (32) and drain electrode (33), and an annealing step of annealing the oxide semiconductor layer (13).

5 Claims, 10 Drawing Sheets

(51) Int. Cl.
- *H01L 27/12* (2006.01)
- *H01L 29/45* (2006.01)
- *H01L 21/02* (2006.01)
- *H01L 21/441* (2006.01)
- *H01L 21/477* (2006.01)
- *H01L 29/417* (2006.01)
- *G02F 1/1362* (2006.01)
- *G02F 1/1368* (2006.01)

(56) References Cited

FOREIGN PATENT DOCUMENTS

| | | |
|---|---|---|
| JP | 05-211242 A | 8/1993 |
| JP | 2010-065317 A | 3/2010 |
| WO | 2010/092810 A1 | 8/2010 |
| WO | 2011/148537 A1 | 12/2011 |

* cited by examiner

METHOD OF MANUFACTURING THIN FILM TRANSISTOR SUBSTRATE AND THIN FILM TRANSISTOR SUBSTRATE MANUFACTURED BY THE METHOD

TECHNICAL FIELD

The present invention relates to methods of manufacturing thin film transistor substrates and thin film transistor substrates manufactured by the methods, and more particularly to methods of manufacturing thin film transistor substrates using passivation films and thin film transistor substrates manufactured by the methods.

BACKGROUND ART

Thin film transistor substrates are provided with, for example, thin film transistors (hereinafter also referred to as TFT) as switching elements for respective pixels which are the minimum units of images.

Passivation films, which are insulating films for protecting TFTs, lines, etc., are formed on substrates to improve the reliability of thin film transistor substrates. The passivation films are inorganic insulating films such as silicon oxide films and silicon nitride films.

Thin film transistor substrates generally include gate electrodes, source electrodes, and drain electrodes forming the above-described TFTs and lines. These electrodes and lines are made of copper (Cu) having low resistance and requiring low costs.

However, copper is generally less adhesive to glass substrates and insulating films such as the above-described passivation films, and thus electrodes and lines made of copper are easily removed from the glass substrates and the insulating films.

In order to address the problem, a thin film transistor substrate is disclosed, which includes electrodes and lines made of a copper alloy containing at least one selected from the group consisting of titanium (Ti), aluminum (Al), and magnesium (Mg) at a concentration ranging from 0.1 to 10 at %.

For example, conventional art teaches as follows (see, e.g., Patent Document 1). When a source electrode, etc., made of a copper alloy containing titanium is fabricated, a film of the copper alloy is formed and then subjected to thermal treatment (e.g., at 350-450° C. for 30-120 minutes). Titanium is then diffused to the surface of the film and reacts with oxygen of air to form a titanium oxide (TiOx) film on the surface of the copper alloy. As a result, the adhesiveness with a glass substrate and an insulating film such as a passivation film improves.

CITATION LIST

Patent Document

Patent Document 1: Japanese Unexamined Patent Publication No. 2010-65317

SUMMARY OF THE INVENTION

Technical Problem

In recent years, in place of conventional thin film transistors using semiconductor layers made of amorphous silicon, TFTs using oxide semiconductor layers (hereinafter also referred to as oxide semiconductor layers) formed by high mobility indium gallium zinc oxide (IGZO)-based oxide semiconductor films are suggested as switching elements for pixels, which are minimum units of images, on thin film transistor substrates.

The above-described passivation films are often formed, for example, by forming inorganic insulating films by plasma chemical vapor deposition (CVD) and patterning the inorganic insulating films. Thus, in thin film transistor substrates using oxide semiconductor layers, the channel regions of the oxide semiconductor layers exposed from source electrodes and drain electrodes may be damaged by plasma, thereby deteriorating TFT characteristics.

In order to address the deterioration in the TFT characteristics, passivation films covering TFTs are formed, and then the oxide semiconductor layers are subjected to, for example, thermal treatment (i.e., annealing) at a temperature of 350° C. or higher for one hour or longer.

However, in the above-described conventional thin film transistor substrate, an unexpected long time (e.g., 120 minutes or longer) is needed to diffuse titanium in the copper alloy to the film surface in the above-described thermal treatment. Thus, the titanium oxide film is not sufficiently formed on the surface of the copper alloy in the above-described annealing after forming the passivation film.

The adhesiveness between the electrodes made of the copper alloy and the passivation film may deteriorate in the annealing. As a result, the electrodes made of copper are easily removed from the passivation film.

The present invention was made in view of the problem. The present invention provides a method of manufacturing a thin film transistor substrate and a thin film transistor substrate manufactured by the method, which reduces removal of electrodes made of copper from a passivation film when the passivation film is formed on the surface of a copper film.

Solution to the Problem

In order to achieve the objective, a method of manufacturing a thin film transistor substrate according to the present invention includes an insulating substrate, an oxide semiconductor layer provided on the insulating substrate and having a channel region, a source electrode and a drain electrode provided on the oxide semiconductor layer to face one another with the channel region interposed therebetween, and a passivation film covering the oxide semiconductor layer, the source electrode, and the drain electrode. The method includes at least a semiconductor layer forming step of forming the oxide semiconductor layer on the insulating substrate; a source/drain forming step of forming the source electrode and the drain electrode, each of which is a multilayer film of a first conductive film provided on the oxide semiconductor layer and made of titanium or molybdenum; a second conductive film provided on the first conductive film and made of copper, and a third conductive film provided on the second conductive film and made of titanium oxide; a passivation film forming step of forming the passivation film which is an inorganic insulating film on the oxide semiconductor layer, the source electrode, and the drain electrode; and an annealing step of annealing the oxide semiconductor layer.

With this configuration, the third conductive film made of titanium oxide is formed on the second conductive film made of copper on the source electrode and the drain electrode. That is, different from the above-described conventional art, the annealing after forming the passivation film is performed with the third conductive film made of titanium oxide formed on the surface of the second conductive film made of copper. The annealing is thus performed with improved adhesiveness between the source and drain electrodes, and the passivation film. As a result, removal of the source electrode and the drain electrode from the passivation film is reduced in the annealing.

In the method of manufacturing the thin film transistor substrate according to the present invention, in the source/drain forming step, the titanium oxide forming the third conductive film is formed by thermal treatment or plasma treatment of a titanium film formed on the second conductive film.

With this configuration, the titanium film formed on the second conductive film is subjected to the thermal treatment in the presence of oxygen, or the titanium film comes into contact with oxygen gas plasma to be oxidized, thereby forming the titanium oxide film. This improves the adhesiveness between the titanium oxide film and the passivation film to reduce removal of the films.

In the method of manufacturing the thin film transistor substrate according to the present invention, the third conductive film has a thickness ranging from 5 nm to 10 nm.

With this configuration, since the third conductive film has the small thickness, the protrusion of the third conductive film is removed above the channel region, for example, by performing ashing. This reduces leakage at the thin film transistor caused by the contact between, for example, the protrusion of the third conductive film and the other electrodes, lines, etc.

A method of manufacturing a thin film transistor substrate according to the present invention includes an insulating substrate, an oxide semiconductor layer provided on the insulating substrate and having a channel region, a source electrode and a drain electrode provided on the oxide semiconductor layer to face one another with the channel region interposed therebetween, and a passivation film covering the oxide semiconductor layer, the source electrode, and the drain electrode. The method includes at least a semiconductor layer forming step of forming the oxide semiconductor layer on the insulating substrate; a metal film forming step of forming a first conductive film provided on the oxide semiconductor layer and made of titanium or molybdenum, a second conductive film provided on the first conductive film and made of copper, and a copper-titanium alloy film provided on the second conductive film and containing titanium within a range from 20 at % to 50 at %, both inclusive; a passivation film forming step of forming a passivation film which is an inorganic insulating film on the oxide semiconductor layer, the first conductive film, the second conductive film, and the copper-titanium alloy film; and a source/drain forming step of forming the source electrode and the drain electrode, each of which is a multilayer film of the first conductive film, the second conductive film, and a third conductive film including the copper-titanium alloy film and a titanium oxide film, by annealing the oxide semiconductor layer, and forming the titanium oxide film on the surface of the copper-titanium alloy film by the annealing.

With this configuration, the annealing rapidly diffuses the titanium in the copper-titanium alloy film to the surface of the copper-titanium alloy film to allow the titanium to react with the oxygen supplied from the passivation film, thereby forming the titanium oxide film on the surface of the copper-titanium alloy film. Then, the third conductive film including the copper-titanium alloy film and the titanium oxide film is formed. As a result, the source electrode and the drain electrode are formed, each of which is the multilayer film of the first to third conductive films. Different from the above-described conventional art, the titanium in the copper-titanium alloy film is diffused to the film surface by the annealing in a short time (e.g., 15 minutes). In the annealing after forming the passivation film, the titanium oxide film is rapidly and sufficiently formed on the surface of the copper-titanium alloy film. Different from the above-described conventional art, the annealing after forming the passivation film ends with the third conductive film including the titanium oxide film formed on the surface of the second conductive film made of copper. The annealing ends with improved adhesiveness between the source and drain electrodes, and the passivation film. As a result, removal of the source electrode and the drain electrode from the passivation film is reduced in the annealing.

Different from the above-described conventional art, the copper-titanium alloy film containing titanium at a high concentration is formed independently from the second conductive film made of copper, thereby increasing the speed of forming the titanium oxide film on the surface of the titanium in the copper-titanium alloy film. This reduces an increase in the resistance of the second conductive film made of copper even if the concentration of titanium in the copper-titanium alloy film increases.

In the method of manufacturing the thin film transistor substrate according to the present invention, the oxide semiconductor layer is preferably made of metal oxide containing at least one selected from the group consisting of indium (In), gallium (Ga), aluminum (Al), copper (Cu), and zinc (Zn).

With this configuration, since the oxide semiconductor layer made of the material(s) has high mobility even in an amorphous state, the on-resistance of the switching element increases.

In the method of manufacturing the thin film transistor substrate according to the present invention, the oxide semiconductor layer may be made of indium gallium zinc oxide.

With this configuration, the thin film transistor has excellent characteristics such as high mobility and low off-current.

The thin film transistor substrate according to the present invention is manufactured by the method of manufacturing the thin film transistor substrate according to the present invention. Thus, a thin film transistor substrate is provided, which has advantages similar to those provided by the method of manufacturing the thin film transistor substrate according to the present invention.

Advantages of the Invention

The present invention reduces removal of a source electrode and a drain electrode from a passivation film in annealing.

DESCRIPTION OF EMBODIMENTS

Embodiments of the present invention will be described hereinafter in detail with reference to the drawings. The present invention is not limited to the following embodiments.

First Embodiment

Figure 1:
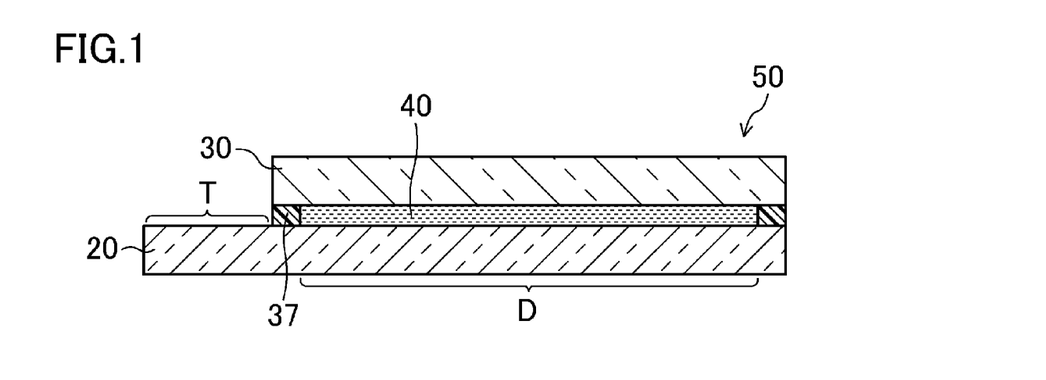
FIG. 1 is a cross-sectional view of a liquid crystal display device including a thin film transistor substrate according to a first embodiment of the present invention.
Figure 2:
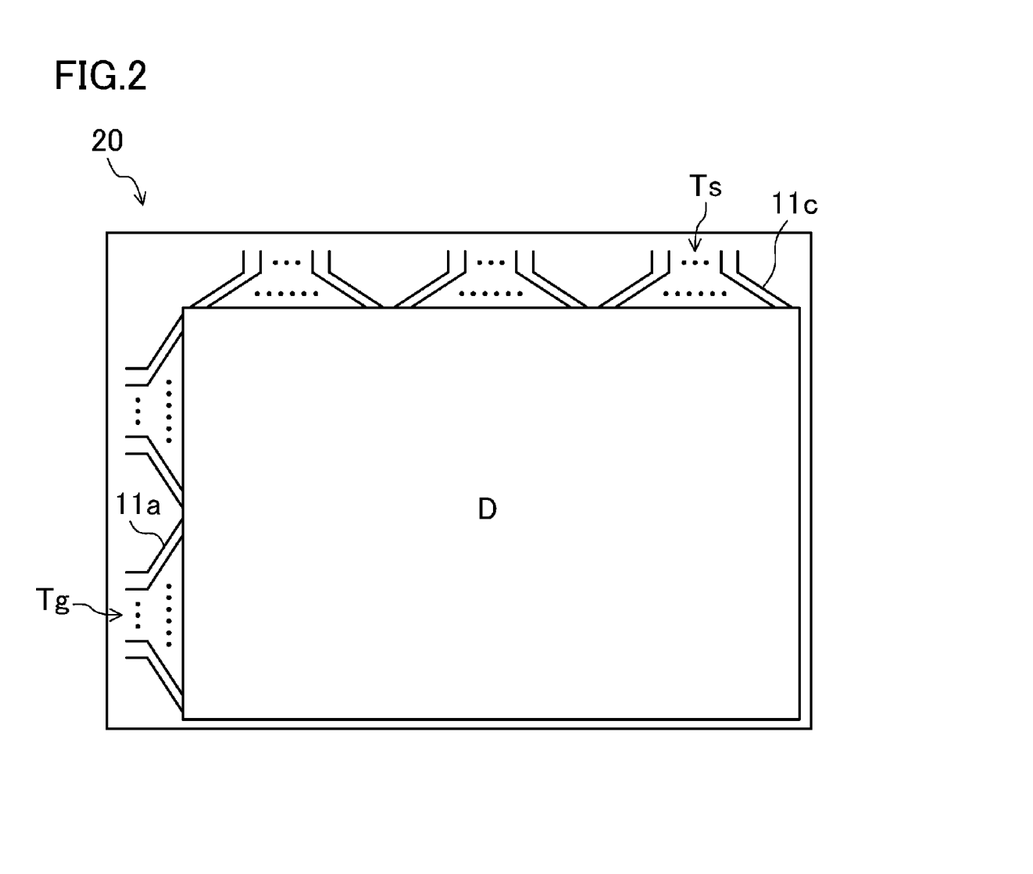
FIG. 2 is a top view of the thin film transistor substrate according to the first embodiment of the present invention.
Figure 3:
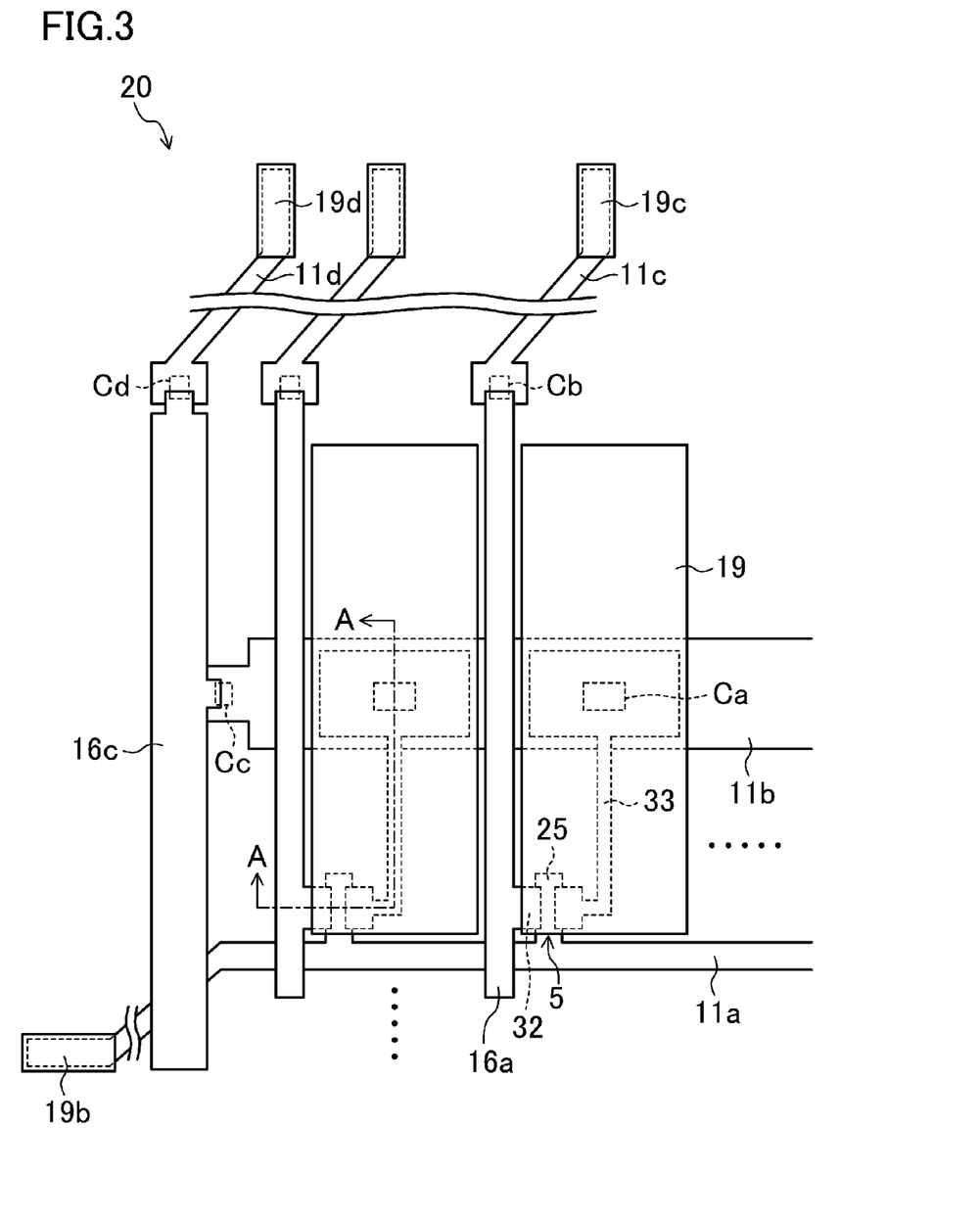
FIG. 3 is an enlarged top view of a pixel section and a terminal section of the thin film transistor substrate according to the first embodiment of the present invention.
Figure 4:
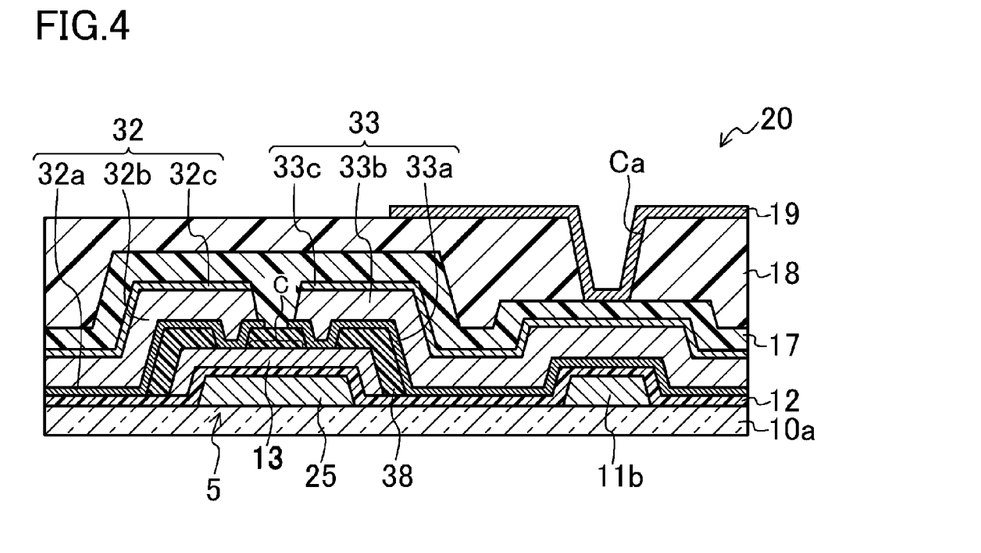
FIG. 4 is a cross-sectional view taken along the line A-A of FIG. 3.

FIG. 1 is a cross-sectional view of a liquid crystal display device including a thin film transistor substrate according to a first embodiment of the present invention. FIG. 2 is a top view of the thin film transistor substrate according to the first embodiment of the present invention. FIG. 3 is an enlarged top view of a pixel section and a terminal section of the thin film transistor substrate according to the first embodiment of the present invention. FIG. 4 is a cross-sectional view taken along the line A-A of FIG. 3.

As shown in FIG. 1, a liquid crystal display device 50 includes a thin film transistor substrate 20 and a counter substrate 30, which face one another, a liquid crystal layer 40 provided between the thin film transistor substrate 20 and the counter substrate 30, and a sealing material 37 provided in a frame shape to adhere the thin film transistor substrate 20 to the counter substrate 30, and enclose the liquid crystal layer 40 between the thin film transistor substrate 20 and the counter substrate 30.

As shown in FIG. 1, in the liquid crystal display device 50, the inside of the sealing material 37 is defined as a display region D displaying images, while the protrusion of the thin film transistor substrate 20 beyond the counter substrate 30 is defined as a terminal region T.

As shown in FIGS. 2, 3, and 4, the thin film transistor substrate 20 includes an insulating substrate 10a, a plurality of scanning lines 11a extending in parallel in the display region D on the insulating substrate 10a, a plurality of auxiliary capacitive lines 11b extending in parallel between respective pairs of the scanning lines 11a, and a plurality of signal lines 16a extending in parallel in the direction orthogonal to the scanning lines 11a.

The thin film transistor substrate 20 includes a plurality of TFTs 5 provided at respective intersections between the scanning lines 11a and the signal lines 16a, that is, in the pixels, a passivation film 17 covering the TFTs 5, and a flat film 18 covering the passivation film 17. The thin film transistor substrate 20 also includes a plurality of pixel electrodes 19 provided in a matrix on the flat film 18 and connected to the respective TFTs 5, and an alignment film (not shown) covering the pixel electrodes 19.

As shown in FIGS. 2 and 3, the scanning lines 11a are drawn to a gate terminal region Tg of the terminal region T (see FIG. 1), and connected to gate terminals 19b in the gate terminal region Tg.

As shown in FIG. 3, the auxiliary capacitive lines 11b are connected to an auxiliary capacitive terminal 19d via an auxiliary capacitive main line 16c and a relay line 11d. The auxiliary capacitive main line 16c is connected to the auxiliary capacitive lines 11b via contact holes Cc formed in a gate insulating film 12, and connected to the relay line 11d via a contact hole Cd formed in the gate insulating film 12.

As shown in FIGS. 2 and 3, the signal lines 16a are drawn as relay lines 11c to a source terminal region Ts of the terminal region T (see FIG. 1), and connected to source terminals 19c in the source terminal region Ts. As shown in FIG. 3, the signal lines 16a are connected to the relay lines 11c via contact holes Cb formed in the gate insulating film 12.

As shown in FIGS. 3 and 4, each TFT 5 includes a gate electrode 25 provided on the insulating substrate 10a, the gate insulating film 12 provided on the gate electrode 25 to cover the gate electrode 25, and an oxide semiconductor layer 13 provided in an insular shape on the gate insulating film 12 to overlap the gate electrode 25 and having a channel region C.

Each TFT 5 also includes a source electrode 32 and a drain electrode 33 provided on the oxide semiconductor layer 13 to overlap the gate electrode 25 and face one another with the channel region C interposed therebetween.

As shown in FIG. 3, the gate electrode 25 is the portion of each scanning line 11a protruding to a side. As shown in FIG. 3, the source electrode 32 is the portion of one of the signal lines 16a protruding to a side. As shown in FIG. 4, the source electrode 32 is a multilayer film of a first conductive film 32a, a second conductive film 32b, and a third conductive film 32c.

As shown in FIGS. 3 and 4, the drain electrode 33 is a multilayer film of a first conductive film 33a, a second conductive film 33b, and a third conductive film 33c, and connected to one of the pixel electrodes 19 via a contact hole Ca formed in the multilayer film of the passivation film 17 and the flat film 18. The drain electrode 33 overlaps one of the auxiliary capacitive lines 11b via the gate insulating film 12 to form an auxiliary capacitor.

In this embodiment, the oxide semiconductor layer 13 is made of oxide semiconductor such as indium gallium zinc oxide (IGZO).

The oxide semiconductor has high mobility than amorphous silicon. Thus, the TFTs using the oxide semiconductor layer operate at a higher speed than conventional TFTs using an amorphous silicon semiconductor layer. Furthermore, the oxide semiconductor film is formed by a process more simple than those of polycrystal silicon films, and is thus applicable to devices requiring large areas.

In this embodiment, as shown in FIG. 4, a channel protection layer (i.e., an etching stopper layer) 38 for protecting the channel region C of the oxide semiconductor layer 13 is provided on the channel region C.

By providing the channel protection layer 38, the channel region C of the oxide semiconductor layer 13 is protected from being etched, when the source electrode 32 and the drain electrode 33 are formed by patterning by etching in a source/drain forming step, which will be described later.

Figure 7A:
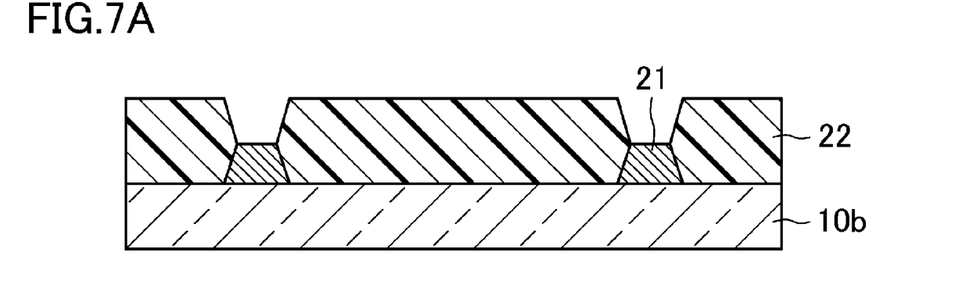
FIG. 7 are cross-sectional views illustrating steps of manufacturing a counter substrate according to the first embodiment of the present invention.
Figure 7B:
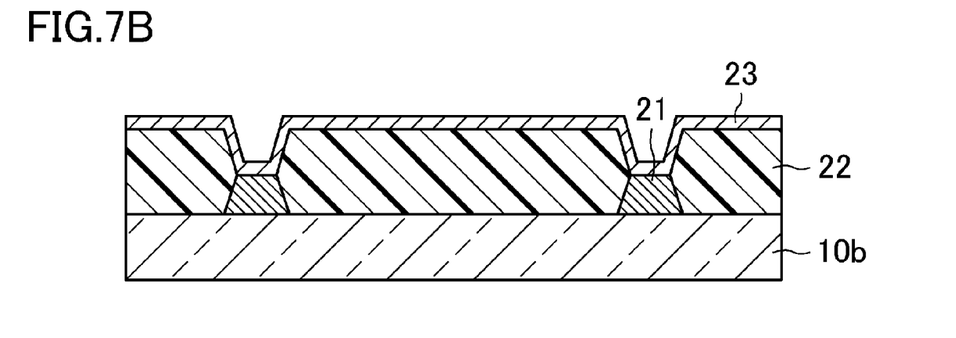
Figure 7C:
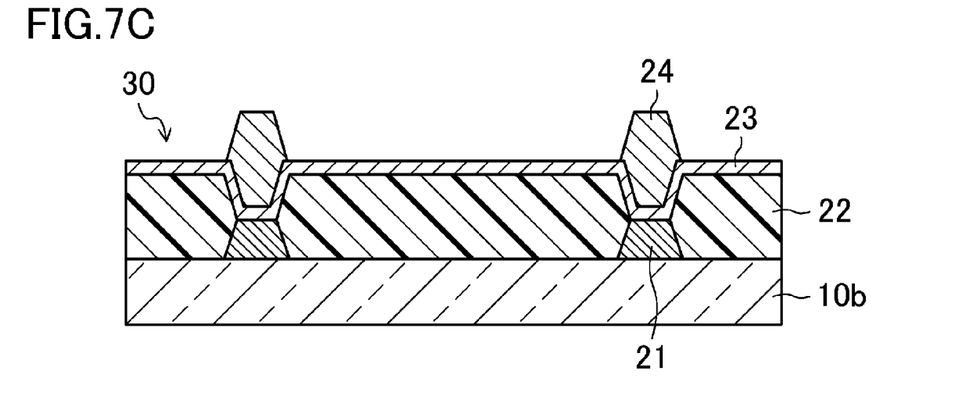

As shown in FIG. 7(c), which will be described later, the counter substrate 30 includes an insulating substrate 10b, a black matrix 21 provided in a lattice on the insulating substrate 10b, and a color filter layer including a color layer 22 such as a red layer, a green layer, and a blue layer provided between lattices of the black matrix 21.

The counter substrate 30 includes a common electrode 23 covering the color filter layer, photo spacers 24 provided on the common electrode 23, and an alignment film (not shown) covering the common electrode 23.

The liquid crystal layer 40 is made of a nematic liquid crystal material having electroptical characteristics.

In the liquid crystal display device 50 having the above-described structure, in each pixel, when a gate signal is sent from a gate driver (not shown) to the gate electrode 25 via the scanning line 11a to turn on the TFT 5, a source signal is sent from a source driver (not shown) to the source electrode 32 via the signal line 16a. Then, a predetermined charge is written in the corresponding one of the pixel electrode 19 via the oxide semiconductor layer 13 and the drain electrode 33.

At this time, a potential difference occurs between the pixel electrodes 19 of the thin film transistor substrate 20 and the common electrode 23 of the counter substrate 30. As a result, a predetermined voltage is applied to the liquid crystal layer 40, that is, liquid crystal capacitors of the pixels and auxiliary capacitors connected in parallel to the liquid crystal capacitors.

The liquid crystal display device 50 displays images by changing the alignment condition of the liquid crystal layer 40 depending on the magnitude of the voltage applied to the liquid crystal layer 40 in each pixel and adjusting the light transmittance of the liquid crystal layer 40.

As shown in FIG. 4, one of the features of this embodiment is that the source electrode 32 is formed by a multilayer film of the first conductive film 32a provided on the insulating substrate 10a and made of titanium or molybdenum, the second conductive film 32b provided on the first conductive film 32a and made of copper, and the third conductive film 32c provided on the second conductive film 32b and made of titanium oxide (TiOx).

Similarly, as shown in FIG. 4, another feature is that the drain electrode 33 is formed by a multilayer film of the first conductive film 33a provided on the insulating substrate 10a and made of titanium or molybdenum, the second conductive film 33b provided on the first conductive film 33a and made of copper, and the third conductive film 33c provided on the second conductive film 33b and made of titanium oxide (TiOx).

In this embodiment, the third conductive films 32c and 33c made of titanium oxide are formed on the second conductive films 32b and 33b made of copper. Thus, different from the above-described conventional art, annealing after forming the passivation film 17 is performed with the third conductive films 32c and 33c made of titanium oxide formed on the surfaces of the second conductive films 32b and 33b made of copper, respectively.

The above-described annealing is performed with improved adhesiveness between the source and drain electrodes 32 and 33, and the passivation film 17. As a result, the removal of the source electrode 32 and the drain electrode 33 from the passivation film 17 is reduced in annealing the oxide semiconductor layer 13.

Next, an example method of manufacturing the liquid crystal display device 50 according to this embodiment will be described with reference FIGS. 5-7. FIGS. 5 and 6 are cross-sectional views illustrating steps of manufacturing the thin film transistor substrate according to the first embodiment of the present invention. FIG. 7 are cross-sectional views illustrating steps of manufacturing the counter substrate according to the first embodiment of the present invention.

First, steps of fabricating the TFTs and the thin film transistor substrate will be described.

Gate Electrode Forming Step

Figure 5A:
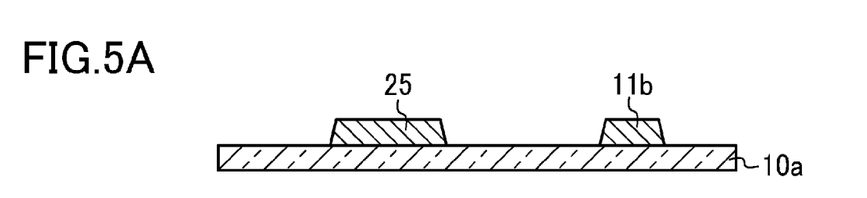
FIG. 5 are cross-sectional views illustrating steps of manufacturing the thin film transistor substrate according to the first embodiment of the present invention.

First, for example, a multilayer film (with a thickness of about 150 nm) of a titanium film and an aluminum film is formed on the entire insulating substrate 10a such as a glass substrate by sputtering. After that, the multilayer film is subjected to photolithography, wet etching, resist removal, and cleaning. As shown in FIGS. 3 and 5(a), the gate electrodes 25 and the scanning lines 11a are formed on the insulating substrate 10a.

At the same time as the formation of the gate electrode 25 and the scanning lines 11a, the signal lines 16a, the auxiliary capacitive lines 11b, and the relay lines 11c and 11d shown in FIGS. 3 and 5(a) are formed.

In this embodiment, an example has been described where the metal film forming the gate electrodes 25 and the scanning lines 11a is the multilayer film of the titanium film and the aluminum film. The gate electrodes 25 may be a metal film such as an aluminum film, a tungsten film, a tantalum film, a chrome film, a titanium film, a copper film, and a molybdenum film, or an alloy film or a metal nitride film containing these metals with a thickness ranging from 50 nm to 300 nm.

Gate Insulating Film Forming Step

Figure 5B:
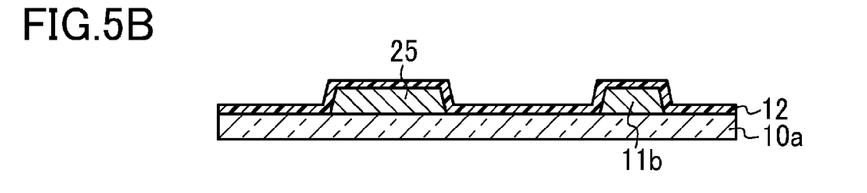

Next, for example, a silicon nitride film (with a thickness ranging from about 200 nm to about 500 nm) is formed by CVD on the entire substrate formed with the gate electrodes 25 and auxiliary capacitive lines 11b. As a result, as shown in FIG. 5(b), the gate insulating film 12 is formed to cover the gate electrodes 25 and the auxiliary capacitive lines 11b.

The gate insulating film 12 may have a multilayer structure of two layers. In this case, for example, a silicon oxide ($SiO_x$) film, a silicon nitride oxide film ($SiO_xN_y$, where x>y), a silicon nitride oxide film ($SiN_xO_y$, where x>y), etc., may be used other than the above-described silicon nitride film ($SiN_x$).

In view of preventing the diffusion of the impurities from the insulating substrate 10a, the lower gate insulating film may be a silicon nitride film or a silicon nitride oxide film, while the upper gate insulating film may be a silicon oxide film or a silicon oxynitride film.

For example, the silicon nitride film with a thickness ranging from 100 nm to 200 nm may be formed as the lower gate insulating film using reaction gas of $SiH_4$ and $NH_3$. The silicon oxide film with a thickness ranging from 50 nm to 100 nm may be formed as the upper gate insulating film using reaction gas of $N_2O$ and $SiH_4$.

In view of forming the dense gate insulating film 12 with little gate leakage current at a low film formation temperature, rare gas such as argon gas is preferably contained in the reaction gas to be mixed into the insulating film.

Semiconductor Layer Forming Step

After that, an oxide semiconductor film (with a thickness ranging from about 30 nm to about 100 nm) made of, for example, indium gallium zinc oxide (IGZO) is formed on the entire substrate formed with the gate insulating film 12 by sputtering.

Figure 5C:
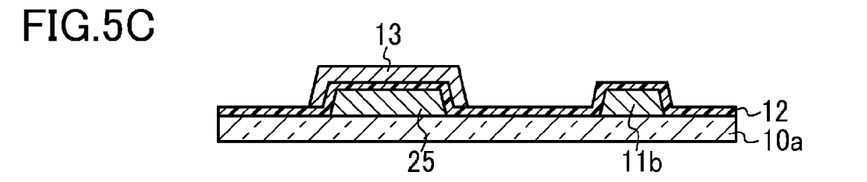

After that, the oxide semiconductor film is subjected to photolithography, wet etching, resist removal, and cleaning, thereby forming the oxide semiconductor layer 13 above the insulating substrate 10a and on the surface of the gate insulating film 12 as shown in FIG. 5(c).

Channel Protection Layer Forming Step

Figure 5D:
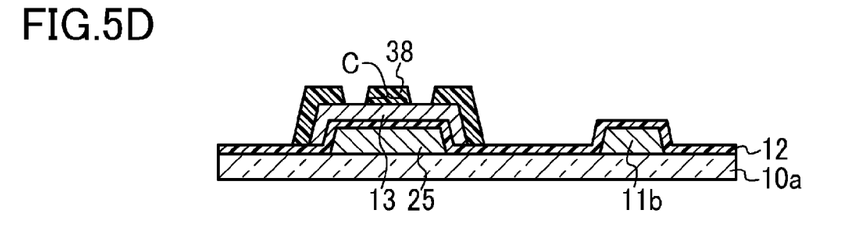
Figure 5E:
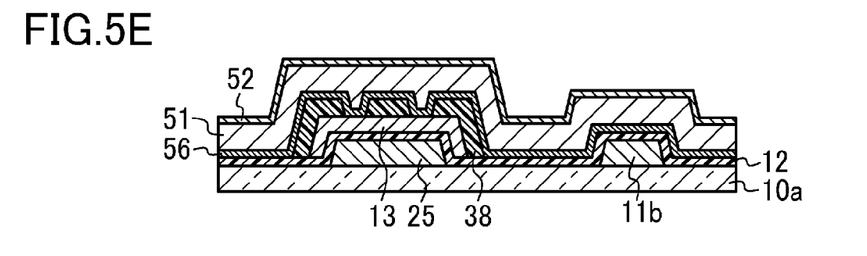

Then, for example, a silicon nitride film, a silicon oxide film, and a silicon nitride oxide film are formed by plasma CVD on the entire substrate formed with the oxide semiconductor layer 13. After that, photolithography using a resist as a mask, etching, resist removal, and cleaning are performed. As a result, the channel protection layer (i.e., the etching stopper layer) 38 with a thickness ranging from about 50 to about 100 nm for protecting the channel region C of the oxide semiconductor layer 13 is formed on the channel region C as shown in FIG. 5(*d*).

Source/Drain Forming Step

Next, as shown in FIG. 5(*e*), for example, a titanium film 56 (with a thickness ranging from 5 to 100 nm) for the first conductive films 32*a* and 33*a*, a copper film 51 (with a thickness ranging from 100 to 500 nm) for the second conductive films 32*b* and 33*b*, and a titanium film 52 (with a thickness ranging from 5 nm to 10 nm) for the third conductive films 32*c* and 33*c* are sequentially formed on the oxide semiconductor layer 13 by sputtering.

Then, the titanium film 52 for the third conductive films 32*c* and 33*c* is subjected to thermal treatment or plasma treatment in oxidizing gas such as oxygen gas and ozone gas, thereby forming the titanium oxide film 53 being the third conductive films 32*c* and 33*c* on the surface of the copper film 51 as shown in FIG. 6(*a*).

Thermal treatment may be performed, for example, in the presence of oxygen (at an oxygen concentration ranging from 20 to 100%, or may be in the air) at 300° C. for an hour.

The plasma treatment may be performed, for example, by allowing oxygen gas plasma (at an oxygen flow rate of 120 sccm and with electric power of 5 kw) to come into contact with the titanium surface for 30 minutes.

Then, as shown in FIG. 6(*b*), the titanium film 56, the copper film 51, and the titanium oxide film 53 are patterned by photolithography using the resist 55 as a photomask having a predetermined pattern.

Figure 6A:
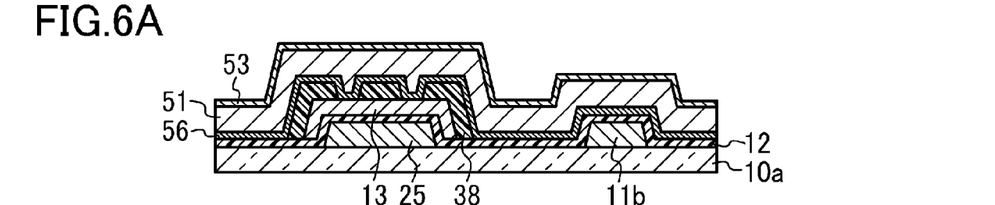
FIG. 6 are cross-sectional views illustrating steps of manufacturing the thin film transistor substrate according to the first embodiment of the present invention.
Figure 6B:
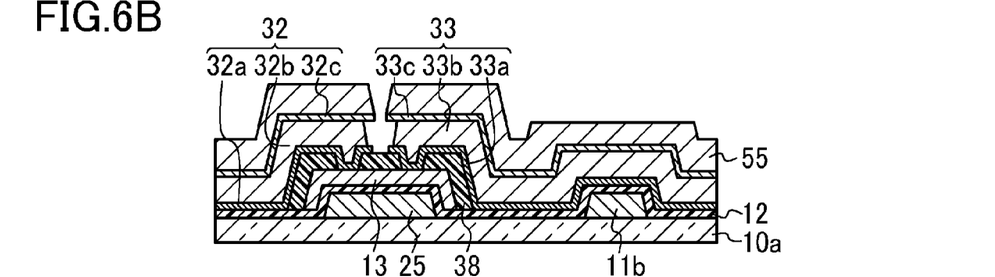

Next, wet etching (e.g., nitric acid, hydrogen peroxide, and fluorine-based wet etching) is performed using the resist 55. As a result, as shown in FIG. 6(*b*), the source electrode 32, which is the multilayer film of the first to third conductive films 32*a*, 32*b*, and 32*c*, is formed, and the drain electrode 33, which is the multilayer film of the first to third conductive films 33*a*, 33*b*, and 33*c*, is formed.

In general, the etching rate of copper forming the second conductive films 32*b* and 33*b* is higher than the etching rate of titanium oxide forming the third conductive films 32*c* and 33*c*. Thus, when subjected to wet etching, as shown in FIG. 6(*b*), the second conductive films 32*b* and 33*b* under the third conductive films 32*c* and 33*c* are overetched above the channel region C to allow the third conductive films 32*c* and 33*c* protrude.

Resist Removing Step

Figure 6C:
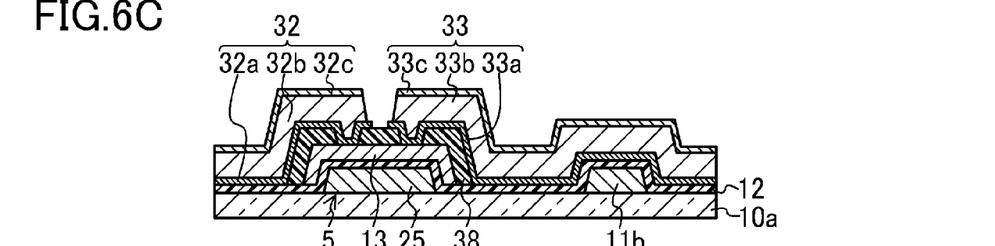
Figure 6D:
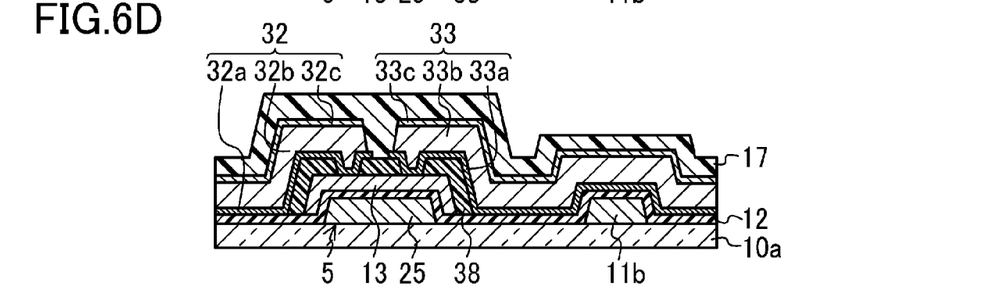

Then, the resist 55 on the source electrode 32 and the drain electrode 33 is removed by ashing. At this time, in this embodiment, as described above, since the titanium film for the third conductive films 32*c* and 33*c* has the thickness ranging from 5 nm to 10 nm, the third conductive films 32*c* and 33*c* also have the thickness ranging from 5 nm to 10 nm Since the third conductive films 32*c* and 33*c* has the small thickness, as shown in FIG. 6(*c*), the protrusions of the third conductive films 32*c* and 33*c* above the channel region C are removed in the above-described ashing.

Therefore, for example, the leakage at the TFTs 5 caused by the contact between the protrusions of the third conductive films 32*c* and 33*c*, and the other electrodes, lines, etc., is reduced.

Passivation Film Forming Step

As shown in FIG. 6(*d*), the passivation film 17, which is an inorganic insulating film such as a silicon nitride film, is formed with a thickness of about 250 nm on the surfaces of the gate insulating film 12 and the TFTs 5 (i.e., the gate electrode 25, the oxide semiconductor layer 13, the source electrode 32, and the drain electrode 33), for example, by plasma CVD (at a film formation temperature 230° C.).

Annealing Step

Then, after the passivation film 17 covering the TFTs 5 is formed to reduce deterioration in the characteristic of the TFTs 5, the oxide semiconductor layer 13 is subjected to predetermined annealing (i.e., thermal treatment).

In this embodiment, as described above, the third conductive films 32*c* and 33*c* made of titanium oxide are formed on the second conductive films 32*b* and 33*b* made of copper in the source electrode 32 and the drain electrode 33. Different from the above-described conventional art, annealing after forming the passivation film 17 is performed with the third conductive films 32*c* and 33*c* made of titanium oxide formed on the surfaces of the second conductive films 32*b* and 33*b* made of copper.

Since the annealing is performed with improved adhesiveness between the source and drain electrodes 32 and 33, and the passivation film 17. As a result, removal of the source electrode 32 and the drain electrode 33 from the passivation film 17 is reduced in the annealing.

The temperature T for the above-described annealing preferably falls within the range expressed by 230° C.<T<450° C. The reasons follow. If the temperature T is 230° C. or lower, which is equal to or lower than the temperature (230° C.) in forming the passivation film 17, deterioration in the characteristics of the TFTs 5 may not be efficiently reduced. If the temperature T is 450° C. or higher, the characteristics may greatly vary among the TFTs 5 formed on the thin film transistor substrate 20.

The time t for the above-described annealing preferably ranges from 0.5 to 4 hours (i.e., 0.5 hour<t<4 hours). The reasons follow. If the time t is shorter than 0.5 hour, which is too short, the characteristics may greatly vary among the TFTs 5 formed on the thin film transistor substrate 20. If the time t is 4 hours or longer, the characteristics may deteriorate in accordance with the variations in the threshold of the TFTs 5.

Flat Film Forming Step

Next, a photosensitive organic insulating film made of photosensitive acrylic resin, etc., is applied, with a thickness ranging from about 1.0 nm to about 3.0 nm, to the entire substrate formed with the passivation film 17 by spin coating or slit coating.

Figure 6E:
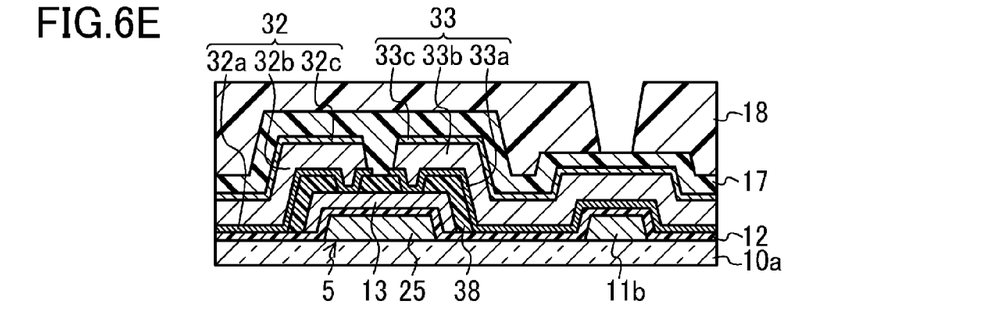

Then, the organic insulating film is subjected to photolithography patterning using resist as a photomask having a predetermined pattern, exposure and development, resist removal, and cleaning. As a result, as shown in FIG. 6(*e*), the flat film 18 having opening in the position corresponding to the contact hole Ca, is formed on the surface of the passivation film 17.

Contact Hole Forming Step

Next, part of the passivation film 17 is removed by dry etching using predetermined etching gas (e.g., $CF_4$ gas and $O_2$ gas) and using the flat film 18 as a mask. As a result, as shown in FIG. 4, the contact hole Ca is formed in the passivation film 17 and the flat film 18.

Pixel Electrode Forming Step

Then, a transparent conductive film such as an ITO film (with a thickness ranging from about 50 nm to about 200 nm) made of, for example, indium tin oxide is formed by sputtering on the entire substrate formed with the passivation film 17 and the flat film 18.

After that, the transparent conductive film is subjected to photolithography patterning using resist as a photomask having a predetermined pattern, exposure, development, resist removal, and cleaning. As a result, as shown in FIG. 4, the pixel electrodes 19, the gate terminals 19b, the source terminals 19c, and the auxiliary capacitive terminal 19d are formed (see FIG. 3).

Where a transmission liquid crystal display device 50 is formed, the pixel electrodes 19 may be made of indium oxide or indium zinc oxide containing tungsten oxide, indium oxide or indium tin oxide containing titanium oxide, etc.

Other than the above-described indium tin oxide (ITO), indium zinc oxide (IZO), indium tin oxide (ITSO) containing silicon oxide, etc., may be used.

Where a reflective liquid crystal display device 50 is formed, a conductive film made of titanium, tungsten, nickel, gold, platinum, silver, aluminum, magnesium, calcium, lithium, and an alloy of these metals may be used as a reflective metal thin film. This metal thin film may be used as the pixel electrodes 19.

In this manner, the thin film transistor substrate 20 shown in FIG. 4 is fabricated.

Counter Substrate Fabricating Step

First, for example, black colored photosensitive resin is applied to the entire substrate of the insulating substrate 10b such as a glass substrate by spin coating or slit coating. Then, the applied film is exposed and developed to form the black matrix 21 with a thickness of about 1.0 μm, as shown in FIG. 7(a).

Next, for example, red, green, or blue colored photosensitive resin is applied to the entire substrate formed with the black matrix 21 by spin coating or slit coating. Then, the applied film is exposed and developed to form the color layer 22 of the selected color (e.g., a red layer) with a thickness of about 2.0 μm as shown in FIG. 7(a).

Similar steps are repeated for the other two colors. Then, the color layers 22 of the other two colors (e.g., a green layer and a blue layer) are formed with a thickness of about 2.0 μm.

Furthermore, a transparent conductive film such as an ITO film is deposited on the substrate formed with the color layers 22 of the colors by sputtering. As a result, as shown in FIG. 7(b), the common electrode 23 is formed with a thickness ranging from about 50 nm to about 200 nm.

At last, photosensitive resin is applied to the entire substrate formed with the common electrode 23 by spin coating or slit coating. Then, the applied film is exposed and developed to form the photo spacers 24 with a thickness of about 4 μm as shown in FIG. 7(c).

In this manner, the counter substrate 30 is fabricated.

Liquid Crystal Injecting Step

First, after a polyimide resin film is applied by printing, to the thin film transistor substrate 20 fabricated in the thin film transistor substrate fabricating step, and the counter substrate 30 fabricated in the counter substrate fabricating step, the applied film is baked and rubbed to form an alignment film.

Then, for example, a sealing material made of ultraviolet (UV) curing and thermosetting resin, etc., is printed in a frame shape on the surface of the counter substrate 30 with the alignment film. Then, a liquid crystal material is dropped inside the sealing material.

After the counter substrate 30 dropped with the liquid crystal material is bonded under reduced pressure to the thin film transistor substrate 20 formed with the alignment film, the bond body is released to air pressure to apply pressure to the front and back surfaces of the bond body.

After the sealing material enclosed in the bond body is irradiated with UV light, the bond body is heated to cure the seal.

At last, the bond body cured with the sealing material is divided by, for example, dicing to remove unnecessary portions.

In this manner, the liquid crystal display device 50 according to this embodiment is manufactured.

Second Embodiment

Next, a second embodiment of the present invention will be described. FIGS. 8-9 are cross-sectional views illustrating steps of manufacturing the thin film transistor substrate according to the second embodiment of the present invention.

The feature of this embodiment is that a titanium oxide film forming the above-described third conductive films 32c and 33c is formed by the above-described annealing step to provide source and drain electrodes 32 and 33.

More specifically, similar to FIGS. 5(a)-5(d) described in the above-described first embodiment, a gate electrode forming step, a gate insulating film forming step, a semiconductor layer forming step, and a channel protection layer forming step are performed first to manufacture the thin film transistor substrate 20 according to this embodiment.

Metal Film Forming Step

Figure 8A:
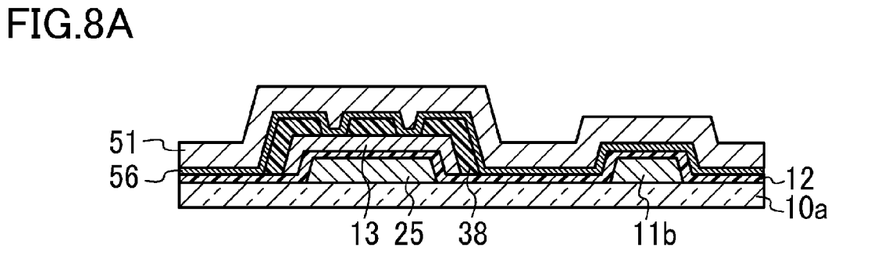
FIG. 8 are cross-sectional views illustrating steps of manufacturing a thin film transistor substrate according to a second embodiment of the present invention.

Next, as shown in FIG. 8(a), similar to the above-described first embodiment, for example, a titanium film 56 (with a thickness ranging from 5 to 100 nm) for first conductive films 32a and 33a, and a copper film 51 (with a thickness ranging from 100 to 500 nm) for second conductive films 32b and 33b are sequentially formed on an oxide semiconductor layer 13 by sputtering.

Figure 8B:
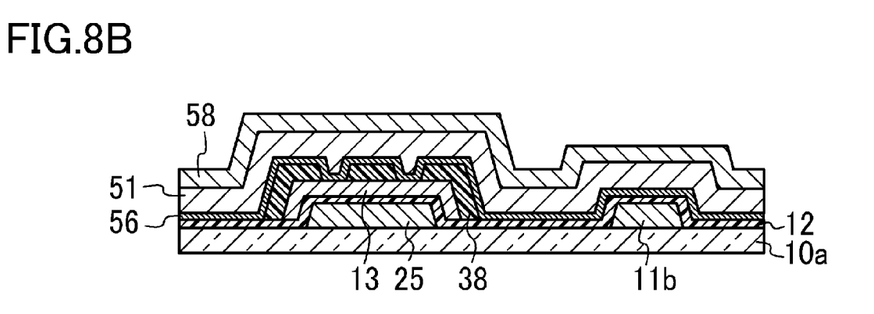

Then, as shown in FIG. 8(b), a copper-titanium alloy film 58 (with a thickness ranging from 5 nm to 100 nm) for the third conductive films 32c and 33c, which contains titanium within the range from 20 at % to 50 at %, is formed on the copper film 51.

In this embodiment, as described above, the copper-titanium alloy film 58 is used for the third conductive films 32c and 33c. As compared to the case where the third conductive films 32c and 33c are made of titanium oxide as in the above-described first embodiment, the difference in the etching rate between the copper film 51 for the second conductive films 32b and 33b, and the copper-titanium alloy film 58 for the third conductive films 32c and 33c is reduced. This efficiently reduces protrusions of the third conductive films 32c and 33c in wet etching, which will be described later, different from the first embodiment.

A copper-titanium alloy film containing titanium lower than 10 at % may be used as the metal film for the second conductive films 32b and 33b, thereby further reducing the difference in the etching rate between the copper-titanium alloy film for the second conductive films 32b and 33b and the copper-titanium alloy film 58 for the third conductive films 32c and 33c. This efficiently reduces protrusions of the third conductive films 32c and 33c in wet etching, which will be described later.

Patterning Step

Figure 8C:
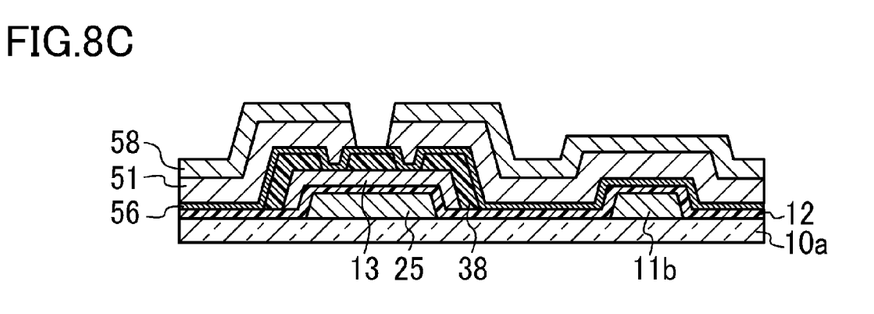

Next, the titanium film 56, the copper film 51, and the copper-titanium alloy film 58 are subjected to wet etching (e.g., nitric acid, hydrogen peroxide, and fluorine-based wet etching) using resist having a predetermined pattern. As a result, as shown in FIG. 8(c), the titanium film 56, the copper film 51, and the copper-titanium alloy film 58 are patterned.

Passivation Film Forming Step

Figure 9A:
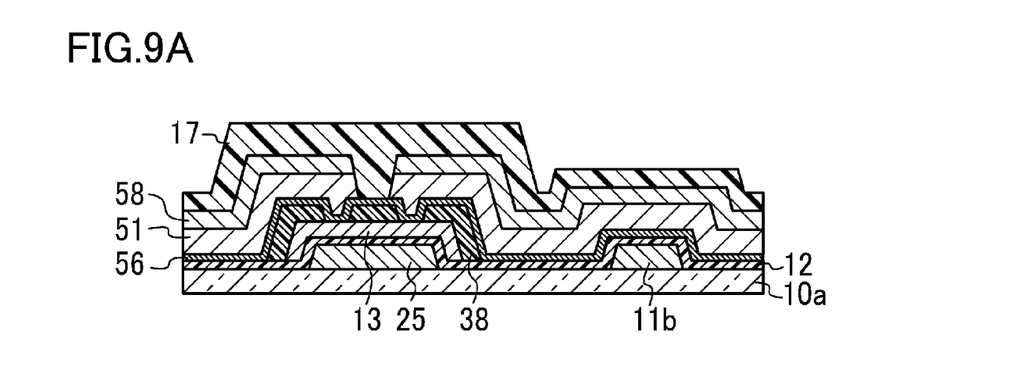
FIG. 9 are cross-sectional views illustrating steps of manufacturing the thin film transistor substrate according to the second embodiment of the present invention.

Then, as shown in FIG. 9(a), the passivation film 17 which is an inorganic insulating film such as a silicon nitride film is formed with a thickness of about 250 nm on the surfaces of the gate insulating film 12, the oxide semiconductor layer 13, the titanium film 56, the copper film 51, and the copper-titanium alloy film 58, for example, by plasma CVD (at a film formation temperature of 230° C.).

Annealing

Next, after forming the passivation film 17, the oxide semiconductor layer 13 is subjected to annealing described in the above-described first embodiment.

At this time, as described above, the copper-titanium alloy film 58 for the third conductive films 32c and 33c contains titanium within the range from 20 at % to 50 at %, both inclusive. Thus, the annealing rapidly diffuses the titanium in the copper-titanium alloy film 58 into the surface of the copper-titanium alloy film 58.

Then, the diffused titanium reacts with the oxygen supplied from the passivation film 17, thereby forming a titanium oxide film 59 on the surface of the copper-titanium alloy film 58. The copper-titanium alloy film 58 and the titanium oxide film 59 form the third conductive films 32c and 33c.

Figure 9B:
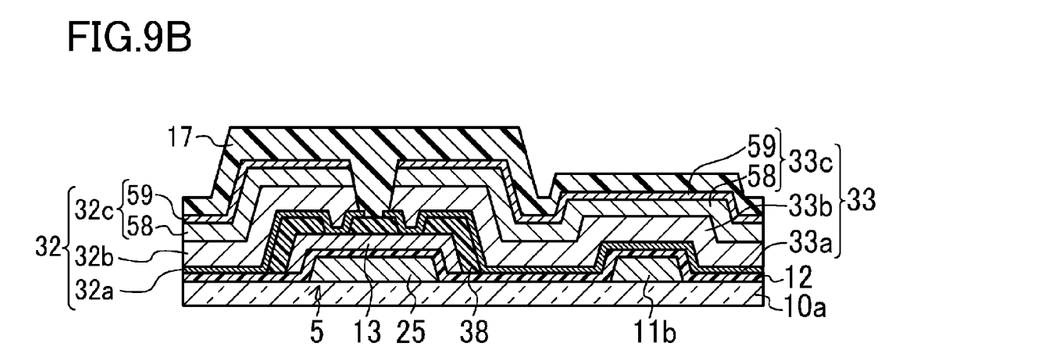

As a result, as shown in FIG. 9(b), the multilayer film of the first to third conductive films 32a, 32b, and 32c forms the source electrodes 32, while the multilayer film of the first to third conductive films 33a, 33b, and 33c forms the drain electrodes 33.

In this embodiment, different from the above-described conventional art, the annealing diffuses the titanium of the copper-titanium alloy film 58 to the film surface in a short time (e.g., 15 minutes). In the above-described annealing after forming the passivation film 17, the titanium oxide film 59 is rapidly and sufficiently formed on the surface of the copper-titanium alloy film 58.

Similar to the first embodiment, different from the above-described conventional art, the annealing after forming the passivation film 17 is performed with the third conductive films 32c and 33c containing titanium oxide formed on the surfaces of the second conductive films 32b and 33b made of copper, respectively.

As such, the annealing is performed with improved adhesiveness between the source and drain electrodes 32 and 33, and the passivation film 17. As a result, removal of the source electrode 32 and the drain electrode 33 from the passivation film 17 is reduced in the annealing.

Different from the above-described conventional art, the copper-titanium alloy film 58 containing titanium at a high concentration is formed independently from the second conductive films 32b and 33b made of copper. This increases the speed for forming the titanium oxide film 59 on the surface of the copper-titanium alloy film 58. Even if the concentration of the titanium in the copper-titanium alloy film 58 increases, an increase in the resistance of the second conductive films 32b and 33b made of copper is avoided.

The conditions for annealing are similar to those in the above-described first embodiment, and detailed description thereof is thus omitted.

Figure 10:
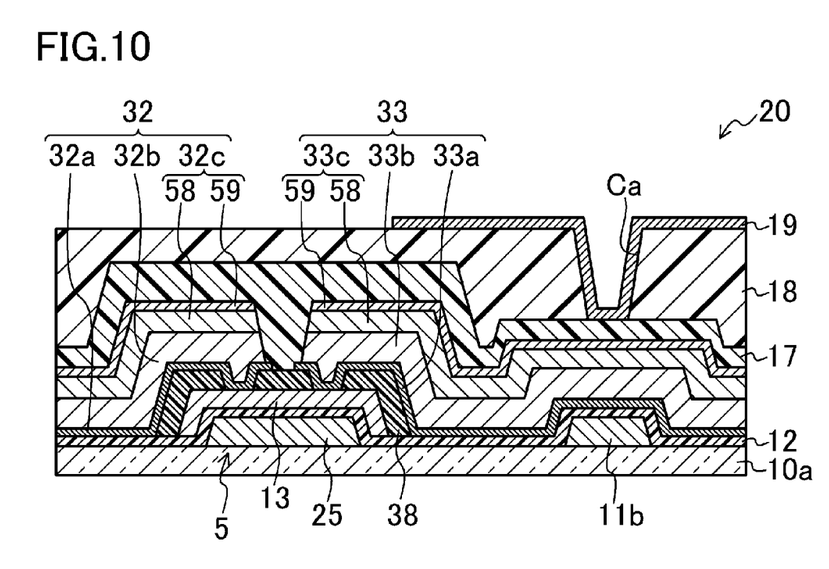
FIG. 10 is a cross-sectional view of the thin film transistor substrate according to the second embodiment of the present invention.

Then, the thin film transistor substrate 20 shown in FIG. 10 is fabricated by performing the flat film forming step, the contact hole forming step, and the pixel electrode forming step described in the above-described first embodiment.

The above-described embodiment may vary as follows.

In the above described embodiment, an example has been described where each TFT 5 has a bottom gate structure including the gate electrode 25 at a position closer to the insulating substrate 10a in the oxide semiconductor layer 13. The present invention is also applicable to a TFT having a top gate structure including the gate electrode 25 at a position opposite to the insulating substrate 10a in the oxide semiconductor layer 13.

Figure 11:
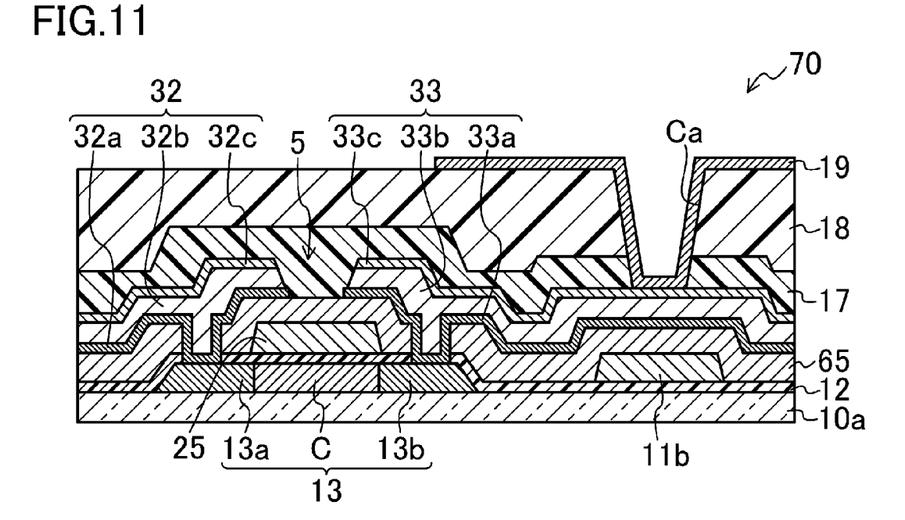
FIG. 11 is a cross-sectional view of a thin film transistor according to a variation of the first embodiment of the present invention.

For example, FIG. 11 illustrates a thin film transistor substrate 70 including top gate TFTs 5 applied with the source electrodes 32 and the drain electrodes 33 included in the thin film transistor substrate 20 having the bottom gate TFTs in the above-described first embodiment.

Similar to the above-described first embodiment, the thin film transistor substrate 70 includes an insulating substrate 10a, the TFTs 5, a passivation film 17 covering the TFTs 5, a flat film 18 covering the passivation film 17, a plurality of pixel electrodes 19 provided in a matrix on the flat film 18 and connected to the respective TFTs 5, and an alignment film (not shown) covering the pixel electrodes 19.

Each TFT 5 includes an oxide semiconductor layer 13 provided on the insulating substrate 10a and having a channel region C, a gate insulating film 12 provided on the surface of the oxide semiconductor layer 13 to cover the oxide semiconductor layer 13, a gate electrode 25 provided on the gate insulating film 12 to overlap the channel region C of the oxide semiconductor layer 13, and an interlayer insulating film 65 provided on the gate insulating film 12 to cover the gate electrode 25 and an auxiliary capacitive line 11b.

In the oxide semiconductor layer 13, a source region 13a and a drain region 13b are formed, which is a pair of high concentration impurity regions, with the channel region C interposed therebetween.

Similar to the above-described first embodiment, the thin film transistor substrate 70 includes the source electrode 32 and the drain electrode 33 provided on the oxide semiconductor layer 13 to overlap the gate electrode 25, and face one another with the channel region C interposed therebetween.

Similar to the above-described first embodiment, the source electrode 32 and the drain electrode 33 includes first conductive films 32a and 33a, second conductive films 32b and 33b, and third conductive films 32c and 33c, respectively. Advantages similar to those in the above-described first embodiment are obtained.

Figure 12:
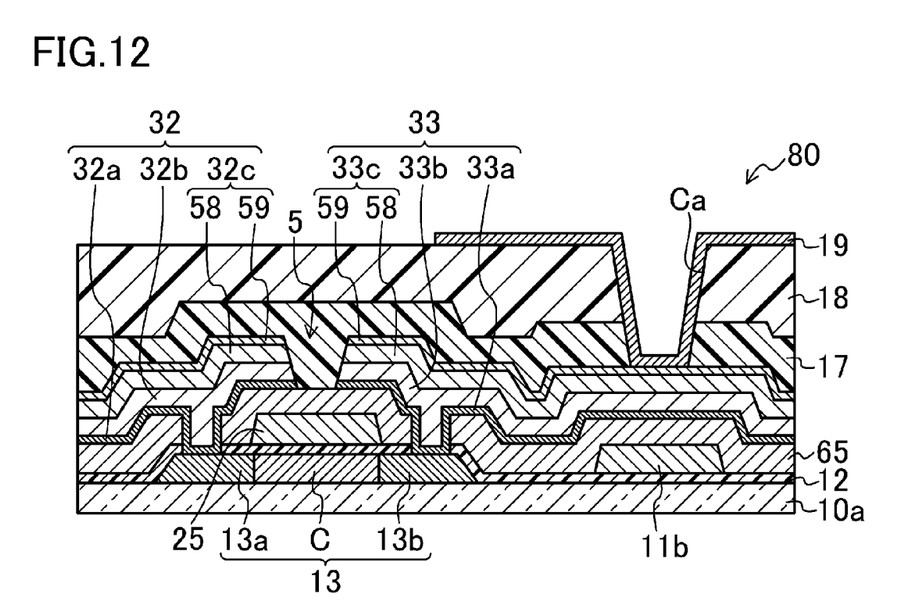
FIG. 12 is a cross-sectional view of a thin film transistor according to a variation of the second embodiment of the present invention.

For example, FIG. 12 illustrates a thin film transistor substrate 80 including top gate TFTs 5 applied with the source electrodes 32 and the drain electrodes 33 included in the thin film transistor substrate 20 having the bottom gate TFTs in the above-described second embodiment.

Similar to the above-described second embodiment, the thin film transistor substrate 80 includes an insulating substrate 10a, the TFTs 5, a passivation film 17 covering the TFTs 5, a flat film 18 covering the passivation film 17, a plurality of pixel electrodes 19 provided in a matrix on the flat film 18 and connected to the respective TFTs 5, and an alignment film (not shown) covering the pixel electrodes 19.

Each TFT 5 includes a oxide semiconductor layer 13 provided on the insulating substrate 10a and having a channel region C, a gate insulating film 12 provided on the surface of the oxide semiconductor layer 13 to cover the oxide semiconductor layer 13, a gate electrode 25 provided on the gate insulating film 12 to overlap the channel region C of the oxide semiconductor layer 13, and an interlayer insulating film 65 provided on the gate insulating film 12 to cover the gate electrode 25 and an auxiliary capacitive line 11b.

In the oxide semiconductor layer 13, a source region 13a and a drain region 13b are formed, which is a pair of high concentration impurity regions, with the channel region C interposed therebetween.

Similar to the above-described second embodiment, the thin film transistor substrate 80 includes the source electrode 32 and the drain electrode 33 provided on the oxide semiconductor layer 13 to overlap the gate electrode 25, and face one another with the channel region C interposed therebetween.

Similar to the above-described second embodiment, the source electrode 32 and the drain electrode 33 are formed by the multilayer film of the first conductive films 32a and 33a, the second conductive films 32b and 33b, and the third conductive films 32c and 33c, respectively. Advantages similar to those in the above-described second embodiment are obtained.

In the above described embodiment, while the oxide semiconductor layer 13 is made of oxide semiconductor such as indium gallium zinc oxide (IGZO), the material of the oxide semiconductor layer 13 is not limited thereto. For example, the material may be metal oxide containing at least any one of indium (In), gallium (Ga), aluminum (Al), copper (Cu), zinc (Zn), magnesium (Mg), and cadmium (Cd).

Since the oxide semiconductor layer 13 made of the material(s) has high mobility even in an amorphous state, the on-resistance of the switching elements increases. This increases the difference in the output voltage in reading data to increase the S/N ratio.

For example, other than IGZO (In—Ga—Zn—O), the oxide semiconductor layer may be made of $InGaO_3(ZnO)_5$, $Mg_xZn_{1-x}O$, $Cd_xZn_{1-x}O$, CdO, etc.

ZnO in an amorphous state, a polycrystal state, or a microcrystal state, that is, the mixture of the amorphous state and the polycrystal state may be used, which is added with one or more types of impurity elements of group 1 elements, group 13 elements, group 14 elements, group 15 elements, or group 17 elements, or not added with the impurities.

The liquid crystal display device 50 according to the embodiments may be any of a twisted nematic (TN) type, a vertical alignment (VA) type, a multi-domain vertical alignment (MVA) type, an advanced super view (ASV) type, etc.

In each embodiment, an example has been described where the display device is the liquid crystal display device including the thin film transistor substrate, the present invention is applicable to other display devices such as organic electro luminescence (EL) display devices, inorganic EL display devices, and electrophoresis display devices.

INDUSTRIAL APPLICABILITY

As described above, the present invention relates to thin film transistor substrates and methods of manufacturing the substrates, and is particularly useful for thin film transistor substrates using flat films and methods of manufacturing the substrates.

DESCRIPTION OF REFERENCE CHARACTERS

5 Thin Film Transistor (TFT)
10a Insulating Substrate
10b Insulating Substrate
11a Scanning Line
11b Auxiliary Capacitive Line
12 Gate Insulating Film
13 Oxide Semiconductor Layer
13a Source Region
13b Drain Region
16a Signal Line
17 Passivation Film
18 Flat Film
19 Pixel Electrode
19b Gate Terminal
19c Source Terminal
19d Auxiliary Capacitive Terminal
20 Thin Film Transistor Substrate
21 Black Matrix
22 Color Layer
23 Common Electrode
24 Photo Spacer
25 Gate Electrode
30 Counter Substrate
32 Source Electrode
32a First Conductive Film
32b Second Conductive Film
32c Third Conductive Film
33 Drain Electrode
33a First Conductive Film
33b Second Conductive Film
33c Third Conductive Film
37 Sealing Material
38 Channel Protection Layer
40 Liquid Crystal Layer
50 Liquid Crystal Display Device
51 Copper Film
52 Titanium Film
53 Titanium Oxide Film
55 Resist
56 Titanium Film
58 Copper-Titanium Alloy Film
59 Titanium Oxide Film
65 Interlayer Insulating Film
70 Thin Film Transistor Substrate
80 Thin Film Transistor Substrate

The invention claimed is:

1. A method of manufacturing a thin film transistor substrate including
an insulating substrate,
an oxide semiconductor layer provided on the insulating substrate and having a channel region,
a source electrode and a drain electrode provided on the oxide semiconductor layer to face one another with the channel region interposed therebetween, and
a passivation film covering the oxide semiconductor layer, the source electrode, and the drain electrode,
the method comprising at least:
a semiconductor layer forming step of forming the oxide semiconductor layer on the insulating substrate;
a metal film forming step of forming a first conductive film provided on the oxide semiconductor layer and made of titanium or molybdenum, a second conductive film provided on the first conductive film and made of copper, and a copper-titanium alloy film provided on the second conductive film and containing titanium within a range from 20 at % to 50 at %, both inclusive;
a passivation film forming step of forming a passivation film which is an inorganic insulating film on the oxide semiconductor layer, the first conductive film, the second conductive film, and the copper-titanium alloy film; and
a source/drain forming step of forming the source electrode and the drain electrode, each of which is a multilayer film of the first conductive film, the second conductive film, and a third conductive film including the copper-titanium alloy film and a titanium oxide film, by annealing the oxide semiconductor layer, and forming the titanium oxide film on the surface of the copper-titanium alloy film by the annealing.

2. The method of claim 1, wherein
the oxide semiconductor layer is made of metal oxide containing at least one selected from the group consisting of indium (In), gallium (Ga), aluminum (Al), copper (Cu), and zinc (Zn).

3. The method of claim 2, wherein
the oxide semiconductor layer is made of indium gallium zinc oxide.

4. A thin film transistor substrate manufactured by the method of claim 1.

5. A thin film transistor substrate manufactured by the method of claim 2.

* * * * *